US 6,750,912 B1

(12) United States Patent
Tennant et al.

(10) Patent No.: US 6,750,912 B1
(45) Date of Patent: Jun. 15, 2004

(54) ACTIVE-PASSIVE IMAGER PIXEL ARRAY WITH SMALL GROUPS OF PIXELS HAVING SHORT COMMON BUS LINES

(75) Inventors: William E. Tennant, Thousand Oaks, CA (US); Lester Kozlowski, Simi Valley, CA (US); Alfredo Tomasini, Thousand Oaks, CA (US)

(73) Assignee: ESS Technology, Inc., Fremont, CA (US)

(*) Notice: Subject to any disclaimer, the term of this patent is extended or adjusted under 35 U.S.C. 154(b) by 0 days.

(21) Appl. No.: 09/408,919

(22) Filed: Sep. 30, 1999

(51) Int. Cl.[7] .............................. H04N 9/64; H04N 3/14; H04N 5/335; H01L 31/062; H01L 31/113
(52) U.S. Cl. ...................... 348/300; 348/302; 348/308; 348/245; 257/292
(58) Field of Search ................................. 348/294, 302, 348/308, 303, 304, 309, 241, 243, 245; 257/281, 292, 215, 230, 229, 231, 232, 233, 291, 294; 250/208.1

(56) References Cited

U.S. PATENT DOCUMENTS

| | | | |
|---|---|---|---|
| 4,249,122 A | 2/1981 | Widlar ........................ 323/313 |
| 4,463,383 A | 7/1984 | Soneda et al. ............... 358/212 |
| 4,466,018 A | 8/1984 | Soneda et al. ............... 358/213 |
| 4,676,761 A | 6/1987 | Poujis ............................ 445/3 |
| 4,794,247 A | 12/1988 | Stineman, Jr. ........... 250/214 A |
| 5,043,820 A | 8/1991 | Wyles et al. ............. 358/213.28 |
| 5,083,016 A | 1/1992 | Wyles et al. ................. 250/208 |
| 5,296,696 A | 3/1994 | Uno ............................ 250/208 |
| 5,345,266 A | 9/1994 | Denyer ........................ 348/300 |
| 5,471,515 A | 11/1995 | Fossum et al. ................ 377/60 |
| 5,541,402 A | 7/1996 | Ackland et al. ............. 250/208 |
| 5,576,763 A | 11/1996 | Ackland et al. ............. 348/308 |
| 5,587,596 A | 12/1996 | Chi et al. .................... 257/223 |
| 5,608,243 A | 3/1997 | Chi et al. .................... 257/249 |
| 5,739,562 A * | 4/1998 | Ackland et al. ............. 257/291 |
| 5,757,426 A * | 5/1998 | Taguchi ...................... 348/243 |
| 5,892,540 A | 4/1999 | Kozlowski et al. ......... 348/300 |
| 5,898,753 A * | 4/1999 | Schick et al. ................. 378/54 |
| 5,973,311 A * | 10/1999 | Sauer et al. ............. 250/208.1 |
| 6,107,655 A * | 8/2000 | Guidash ..................... 257/233 |
| 6,486,913 B1 * | 11/2002 | Afghahi et al. ............. 348/308 |

OTHER PUBLICATIONS

L.J. Kozlowski, et al., "Theoretical basis and experimental confirmation: why a CMOS imager is superior to a CCD," *SPIE*, The International Society for Optical Engineering, vol. 3698, pp. 388–396, Apr. 1999.

R.H. Dyck and G.P. Weckler, "Integrated Arrays of Silicon Photodetectors for Image Sensing," *IEEE Transactions on Electron Devices*, vol. ED-15, No. 4, pp. 196–201, Apr. 1968.

James D. Plummer and James D. Meindl, "MOS Electronics for a Portable Reading Aid for the Blind," *IEEE Journal of Solid-State Circuits*, pp. 111–119, Apr. 1972.

(List continued on next page.)

*Primary Examiner*—Wendy R. Garber
*Assistant Examiner*—Justin Misleh
(74) *Attorney, Agent, or Firm*—Farjami and Farjami LLP

(57) ABSTRACT

A shared output visible imager pixel array combines a high optical fill factor with low read noise. A relatively small group of pixels are connected to a relatively short common bus line. An amplifier located in close proximity with the pixels is connected to the common bus line and shared among the pixels. By reducing the amount of amplifier circuitry associated with each pixel, the optical fill factor is increased. Also, since the bus line is relatively short, the bus capacitance is much lower relative to the traditional passive-pixel designs. On average, the transistor count per pixel can be less than two, for large arrays.

20 Claims, 3 Drawing Sheets

OTHER PUBLICATIONS

Norio Koike, et al., "MOS Area Sensor: Part I–Design Consideration and Performance of an n–p–n Structure 484 × 384 Element Color MOS Imager," *IEEE Transactions on Electron Devices*, vol. ED–27, No. 8, pp. 1676–1681, Aug. 1980.

Shinya Ohba, et al., "MOS Area Sensor: Part II–Low–Noise MOS Area Sensor with Antiblooming Photodiodes," *IEEE Transactions on Electron Devices*, vol. ED–27, No. 8, pp. 1682–1687, Aug. 1980.

EG&G Reticon Sales Catalog, *High–Speed Solid State Image Sensor Array*, RA2568N, pp. 179–186.

EG&G Reticon Sales Catalog, *Solid State Sensor Arrays for Part Nos. RA0100A/RA0128N*, pp. 163–170.

EG&G Reticon Sales Catalog, *Solid State Image Sensor Array for Part No. RA0256B*, pp. 171–178.

Haruhisa Ando, et al., "Design Consideration and Performance of a New MOS Imaging Device," *IEEE Transactions on Electron Devices*, vol. ED–32, No. 8, pp. 1484–1489, Aug. 1985.

Nobuyoshi Tanaka et al., "A Novel Bipolar Imaging Device with Self–Noise–Reduction Capability," *IEEE Transactions on Electron Devices*, vol. 36, No. 1, pp. 31–38, Jan. 1989.

Weckler, G.P., "Storage Mode Operation of a Phototransistor and its Adaptation to Integrated Arrays for Image Detection," *IEDM*, Oct. 1966, (Abstract Only) No known paper available from professional document delivery service.

Nobuyoshi Tanaka, et al., "A Low–Noise Bi–CMOS Linear Image Sensor with Auto–Focusing Function," *IEEE Transactions on Electron Devices*, vol. 36, No. 1, pp. 39–45, Jan. 1989.

N. Tanaka, S. Hashimoto, M. Shinohara, S. Sugawa, M. Morishita, S. Matsumora, Y. Nakamura and T. Ohmi, "A 310k Pixel Bipolar Imager (BASIS)," *ISSCC*, 1989.

Gene P. Weckler, "Charge storage lights the way for solid–state image sensors," *Electronics*, pp. 75–78, May 1, 1967.

Gene P. Weckler, "Operation of p–n Junction Photodetectors in a Photon Flux Integrating Mode," *IEEE Journal of Solid–State Circuits*, vol. SC–2, No. 3, pp. 65–73, Sep. 1967.

Gene P. Weckler and Rudolph H. Dyck, "Integrated Arrays of Silicon Photodetectors for Image Sensing," *WESCON67 Technical Papers, Western Electronic Show and Convention*, Session 13: Solid State Imaging, an Evolving Technology, Aug. 22–25, 1967.

L.J. Kozlowski et al., "Comparison of Passive and Active Pixel Schemes for CMOS Visible Imagers," *SPIE*, vol. 3360, Apr. 1998.

Ming–Jer Chen, et al., "Weak Inversion Charge Injection in Analog MOS Switches," *IEEE Journal of Solid–State Circuits*, vol. 30, No. 5, pp. 604–606, May 1995.

Peter W. Fry, et al., "Fixed–Pattern Noise in Photomatrices," *IEEE Journal of Solid–State Circuits*, vol. SC–5, No. 5, pp. 250–254.

M. DeGrauwe, et al., "Special Correspondence: A Micropower CMOS–Instrumentation Amplifier," *IEEE Journal of Solid–State Circuits*, vol. SC–20, No. 3, Jun. 1985.

Letter dated Jul. 31, 1998, from Gene Weckler, *Rad–Icon Imaging Corp.*, addressed to Mark Wettler.

* cited by examiner

ACTIVE-PASSIVE IMAGER PIXEL ARRAY WITH SMALL GROUPS OF PIXELS HAVING SHORT COMMON BUS LINES

BACKGROUND OF THE INVENTION

1. Field of the Invention

The present invention relates generally to the field of CMOS imagers, and more particularly to a shared output visible imager pixel array.

2. Description of the Related Art

Visible imaging systems implemented in CMOS have the potential for significant reductions in cost and power requirements, as compared to traditional CCD imagers. The prior art describes many alternatives to CCD sensors for generating video or still images. The various schemes can be grouped into two basic classes, passive or active pixel, depending upon whether signal amplification is performed in support circuits or at each pixel. In a passive pixel sensor, pixel simplicity and optical fill factor are maximized. Active-pixel sensors (APS) include an amplifier at each pixel in order to maximize signal transfer and sensitivity, but results in lower optical fill factor.

The simplest passive pixel comprises a photodiode and an access transistor wherein the photo-generated charge is passively transferred from each pixel to downstream circuits. An example of a passive-pixel circuit 10 is shown in FIG. 1. Numerous pixels (usually at least several hundred) are attached to a common bus line 22. Each pixel typically comprises a photodiode 16 and an access transistor 14. A signal from each pixel is read out through its access transistor onto the bus 22. A downstream amplifier 24 then amplifies the signal. A reset transistor 18 resets the photodiodes. Typically, several hundred such pixel rows are combined to form a visible imager array.

The integrated charge from each photodiode must be transferred, however, with low noise and low non-uniformity. Since each column of pixels often shares a common row or column bus for reading the signal, noise and non-uniformity suppression are typically performed in a "column buffer" servicing each bus.

Subsequent efforts to improve the passive-pixel imager have focused on column buffer improvements. One improvement to the column buffer involves using an enhancement/depletion inverter amplifier to provide reasonably large amplification in a small amount of real estate. However, its sensitivity (40 lux) is still nearly an order of magnitude less than competing CCD sensors. Another improvement both enhanced sensitivity and facilitated automatic gain control via charge amplification in the column buffer. Recently, those in the art have used capacitive transimpedance amplifiers as disclosed in U.S. Pat. No. 5,892,540.

Though much progress has been made in developing passive-pixel imagers, their temporal S/N performance is fundamentally inferior to competing CCD imagers because the large bus capacitance translates to a read noise of approximately 100 e–. CCDs, on the other hand, typically have read noise of 20–40 e– at video frame rates. Nevertheless, the allure of producing imagers in coventional MOS fabrication technologies rather than esoteric CCD processes (which require many implantation steps and complex interface circuitry in the camera) has encouraged the development of active-pixel sensors that can better compete with CCDs.

Active-pixel sensors can provide low read noise comparable or superior to scientific grade CCD systems. An example of a typical active-pixel sensor circuit 30 is shown in FIG. 2. A photodiode 32 is directly connected to an amplifier FET 36 in each pixel. A reset FET 34 resets the photodiode and an access FET 38 connects the pixel to an output bus. The active circuit in each pixel of an APS device, however, utilizes cell "real estate" that could otherwise be used to create imagers having optical formats compatible with standard lenses and/or to maximize the sensor optical fill factor for high sensitivity. Active-pixel circuits also may increase power dissipation relative to passive pixel alternatives, increase fixed-pattern noise (possibly requiring additional circuitry to suppress the noise), and limit the scalability of the technology.

In view of the foregoing, it would be desirable to have a CMOS imager combining the high fill factor associated with passive-pixel imagers, with the lower read noise associated with active-pixel designs.

SUMMARY OF THE INVENTION

In general, the present invention combines the active and passive design approaches to form an "active-passive" circuit. The present invention is a shared output visible imager pixel array combining a high optical fill factor with low read noise. A relatively small group of pixels are connected to a relatively short common bus line. An amplifier situated in close proximity to the pixels is connected to the common bus line and shared among the pixels. By reducing the amount of amplifier circuitry associated with each pixel, the optical fill factor is increased. Also, since the bus line is relatively short, the bus capacitance is much lower than in traditional passive pixel designs.

On average, the transistor count per pixel can be less than two, for large arrays. Thus, the present invention is particularly suited for forming high resolution imagers using standard 0.5 $\mu$m CMOS design rules.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide a shared output visible imager pixel array.

Figure 3:
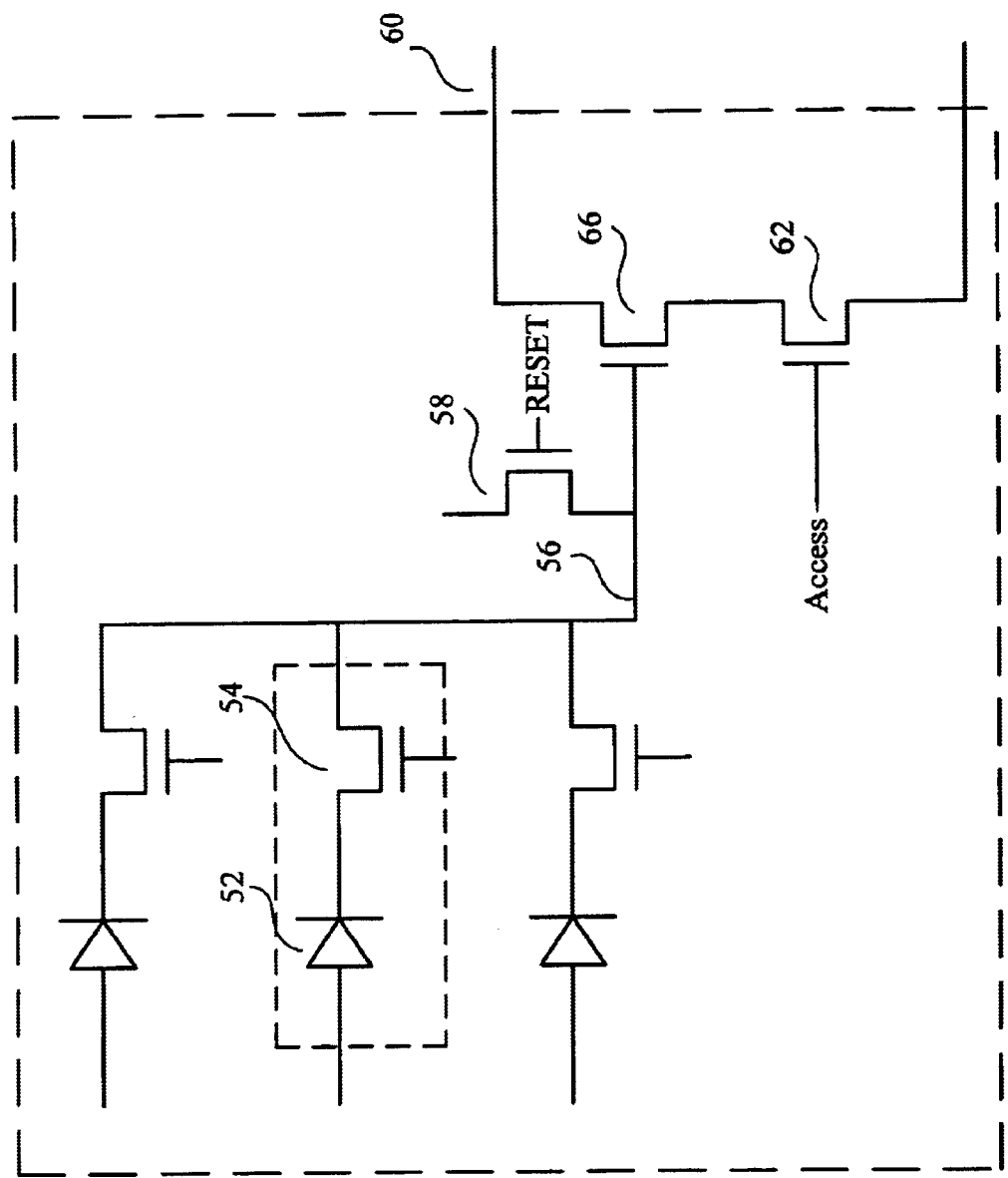
FIG. 3 is a schematic of an embodiment of the present invention.

Active-pixel devices typically require at least three transistors in the input cell, which reduces the fill factor and lowers sensitivity. In addition, the lowest-noise circuits typically require even more circuitry to accommodate the correlated double sampling function necessary to provide the lowest noise. In the passive-pixel sensor approach, it is possible to have a single transistor in the input cell, but this creates high-capacitance bus lines that degrade performance. By sharing the output amplification function among a relatively small number of pixels as shown in FIG. 3, however, the number of transistors per pixel can be reduced. In fact, the average approaches one transistor per pixel for pixel groups of sufficient size. Accordingly, HDTV-size arrays with good fill factor may be fabricated, even with 0.5 µm CMOS design rules.

Figure 1:
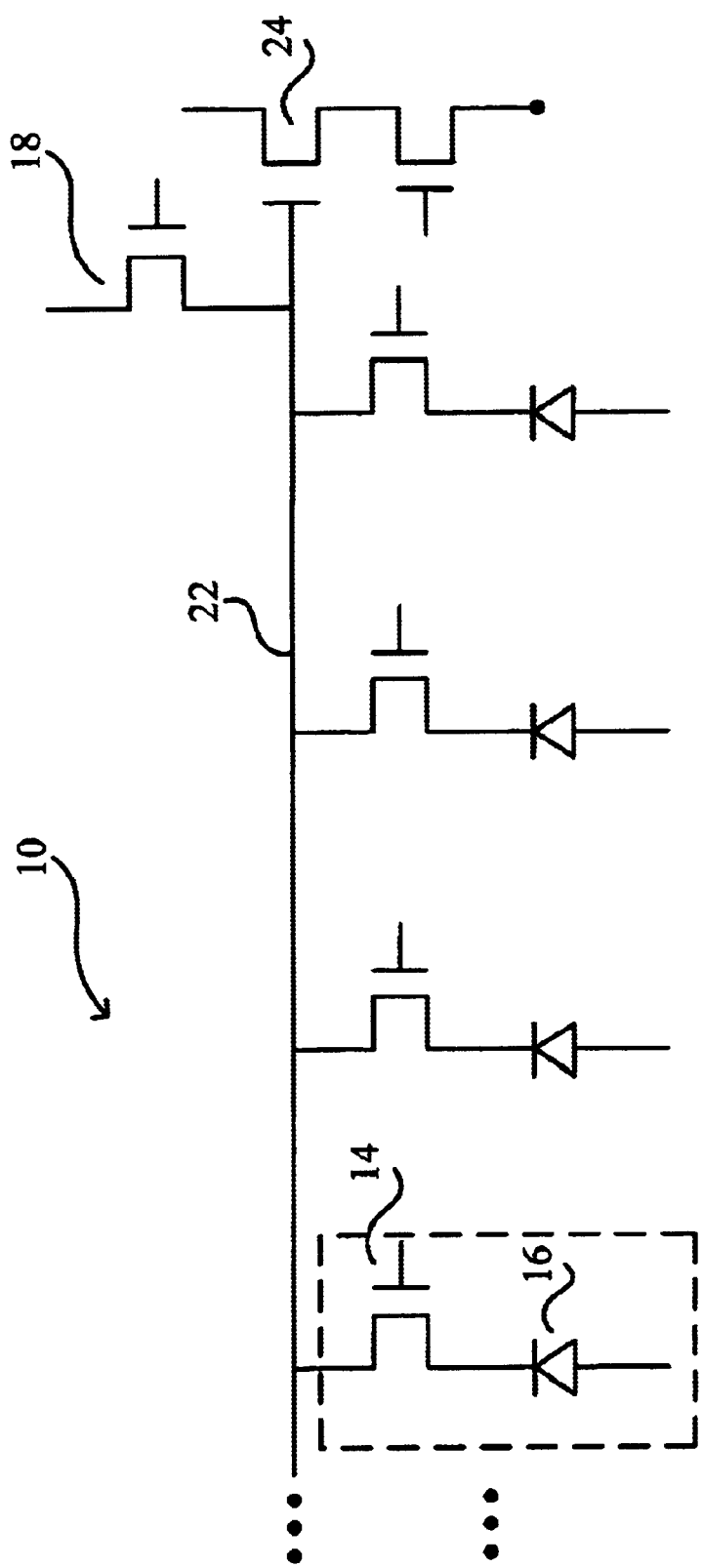
FIG. 1 is a schematic of a prior art passive-pixel circuit.
Figure 2:
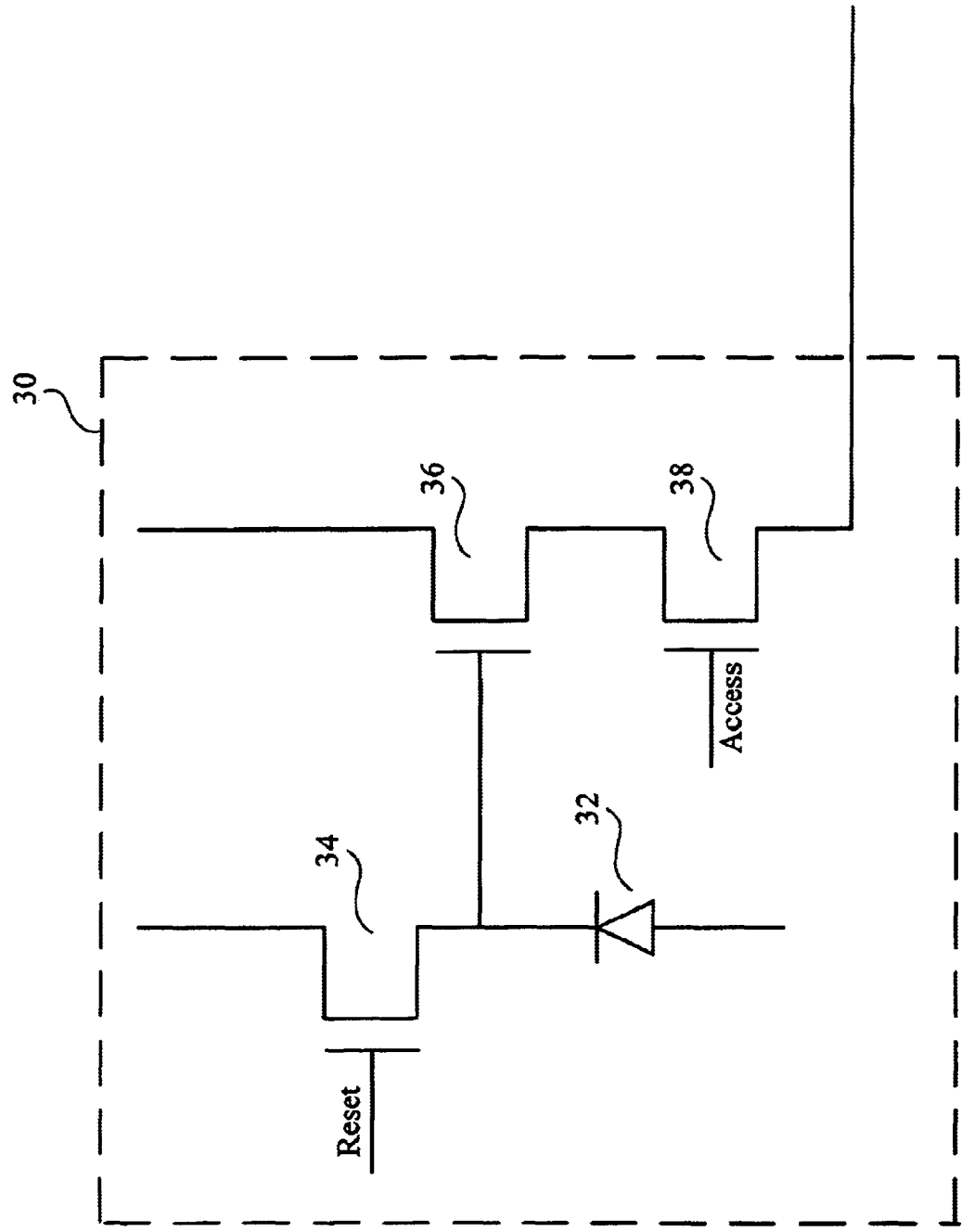
FIG. 2 is a schematic of a prior art active-pixel circuit.

A preferred embodiment of the present invention is illustrated in FIG. 3. A relatively small number of pixels (three in this case) are connected to a common bus line 56. The common bus line 56 is much shorter than the bus line 22 of FIG. 1, since only a small number of pixels need to be connected. Since the bus line is relatively short, the bus capacitance associated with the bus line 56 is much lower than the bus capacitance associated with the bus line 22 of the passive-pixel circuit 10. As in the passive-pixel design, each pixel comprises only a photodiode 52 and an access transistor 54. The common bus line 56 connects each pixel to amplifier circuitry 66 co-located with the pixels, similar to the active-pixel approach. Note that the amplifier is shown as a source-follower but could be any type of amplifier circuit known to those of skill in the art. This amplifier could also include circuitry which incorporates correlated double sampling to reduce 1/f and kTC noise. A row-group reset transistor 58 is used to reset the photodiodes, and an access transistor 62 is used to connect the row-group to a column output. A column select line 60 provides column selection. Since the present invention combines aspects of both the active and passive approaches, it may be termed an "active-passive" design.

The present invention circumvents the two principal limitations associated with the prior art (crowded input cells and/or relatively higher noise inputs) by associating an amplifier with a relatively small group of input cells using a short bus line. The short bus line provides a relatively bus capacitance, as compared to the prior art. As the term is used herein, "low bus capacitance" is defined as significantly less capacitance than a bus line as long an entire row or column, as used in a passive pixel design, but still greater than the capacitance associated with a bus connected to a single pixel. It is clear that the active-passive approach can reduce the transistor count to only two per pixel if three-pixel groups are used, and to lower values as the number of pixels in a group is increased. Thus the present invention can significantly reduce the transistor count, without the penalty of significant bus capacitance. In fact, the bus capacitance in this design approach may be desirable in modest amounts and can be adjusted to suit the needs of a given implementation.

Another advantage of the present invention is that some of the non-uniformity associated with the active-pixel approach is reduced. In the conventional paradigm, with one amplifier per pixel, each pixel has an amplifier offset associated with that pixel. In the present invention, the amplifier offset is now distributed over three (or more) pixels, so the sources of non-uniformity is reduced.

Using three pixels per group would allow three color imagery (i.e. red, green, blue) without artificial fixed pattern noise beyond that associated with the three colors. If necessary, the three pixels may be staggered to maintain the same relative position of the colors to the group amplifier. Careful pixel placement using symmetry may allow higher multiples of three pixels per group without significant fixed pattern noise as well. The use of microlenses would obviate the fixed pattern noise, regardless of the number of pixels per group since the amplifier could be hidden among the dead regions of the microlenses. This would be especially easy if gray-scale microlenses were used.

Another implementation of the present invention uses four pixels per group. Three of the pixels are used for the traditional three colors, and the fourth pixel is a "dark" pixel. The dark pixel is covered and its output signal is used to cancel the amplifier offset associated with the group's amplifier very efficiently. In fact, the amplifier and reset circuitry can be placed in the covered pixel to increase the fill factor even further. Moreover, proper placement and shaping of microlenses combined with the proper placement of the four pixels in the group will eliminate the dead optical area associated with the "dark" pixel. Although embodiments using three or four pixels per group have been disclosed, the present invention may be applied to groups ranging from two to a dozen or more pixels without departing from the scope of the present invention.

Note that the row select FET in the active-passive approach, coupled with the reset FET allows correlated double sampling on the pixel to eliminate KTC noise (assuming that the pixel is reset to a fully depleted state). This approach can also be used with any reset scheme now used for active pixels.

Instead of the photodiode and a reset transistor, a photo capacitor could also be used. In this case the row would be accessed by injecting charge stored under the photocapacitor onto the group bus diodes (which would have to surround the photocapacitor to prevent cross-talk). The diode surrounding each photocapacitor would collect the injected charge by diffusion. These diodes would be connected to the group bus.

The photocapacitor in such a configuration could be made of standard (non-transparent) metal, and still collect light if arranged in an angular fashion with an opening in the center of the pixel into which light is focussed by the pixel's microlens. The open region in the pixel center might be doped p+ to insure good collection of charge by the nearby photocapacitor and by the bus diode when the injection occurs. The group bus diode for this pixel would in turn have to be an annulus around the photocapacitor.

One issue that arises with the present invention is that the floating junctions for the access MOSFETs can pick up light and cause undesirable blooming. This problem may be addressed by several methods known to those skilled in the art. For example, an additional FET may be added to bleed off the charge, or a guard band on the side of the access FET may be added to optically shield it. One possible solution is to form the access FET using a P transistor is a very shallow n-well. This reduces some of the available light collecting area, but may produce a reasonable trade-off for certain applications.

Currently, in order for digital cameras to successfully compete with film cameras, imagers need to have relatively small pixels in order to provide sufficiently high resolution. For example, in standard 0.5 µm CMOS geometry, it is actually impossible to make a pixel less than 5.6 µm pitch, using conventional approaches, and 5.6 µm is not small enough to make a high resolution imager. The present invention is particularly suited for designing high resolution imagers, using standard 0.5 µm CMOS design rules, since more photodiodes per unit area are used, as compared to standard active-pixel designs.

Depending upon the implementation, the present invention may require a more complicated clocking scheme, however, since each "pixel" is really a pixel group. Each pixel in the group requires an access signal, but because each group also requires an access line, an additional signal must be used in the clocking scheme to identify the group within each row.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. An imager array comprising:
   a plurality of pixel groups, each pixel group comprising:
      a plurality of pixels located in close proximity to each other and connected to a common bus line, the common bus line having a relatively low bus capacitance; and
      an amplifier connected to the common bus line, wherein the amplifier is located in close proximity to the plurality of pixels;
      wherein the plurality of pixels comprises four pixels, such that one pixel is a dark pixel used to subtract off an amplifier offset associated with the amplifier.

2. The imager array of claim 1, wherein the amplifier is a FET configured in a source-follower configuration.

3. The imager array of claim 2, wherein a pixel comprises a photodiode and an access transistor.

4. The imager array of claim 1, wherein the common bus line is physically much shorter than a bus line in a standard passive pixel imager.

5. The imager array of claim 4, wherein the plurality of pixels comprises three pixels.

6. The imager array of claim 4, wherein the average number of transistors per pixel in the array is less than two.

7. The imager array of claim 3, wherein the access transistor comprises a p transistor in a shallow n-well, in order to reduce blooming.

8. The imager array of claim 1, wherein the amplifier is located within the dark pixel area.

9. The imager of claim 4, herein each pixel group further comprises an access transistor, and each of the plurality of pixels is connected to the common bus line through a separate access transistor.

10. The imager array of claim 1, wherein a pixel comprises a photocapacitor.

11. An imager array comprising:
    a plurality of pixel groups, each pixel group comprising:
       a common bus line, the common bus line being shorter than a bus line in a standard passive pixel imager and having a relatively low bus capacitance;
       a plurality of passive pixels located in close proximity to each other and connected to the common bus line;
       an amplifier FET connected to the common bus line, wherein the amplifier FET is located in close proximity to the plurality of passive pixels;
       a reset FET connected to the common bus line; and
       an output access FET connected to the amplifier FET and an output bus;
       wherein the plurality of passive pixels comprises four pixels, such that one pixel is a dark pixel used to subtract off an amplifier offset associated with the amplifier FET.

12. The imager array of claim 11, wherein the amplifier FET is configured in a source-follower configuration.

13. The imager array of claim 12, wherein a passive pixel comprises a photodiode and an access transistor.

14. The imager array of claim 13, wherein the photodiode is a source diode of the access transistor.

15. The imager array of claim 13, wherein the plurality of passive pixels 2 comprises three pixels.

16. The imager array of claim 13, wherein the average number of transistors per pixel in the array is less than two.

17. The imager array of claim 16, wherein the access transistor comprises a p transistor in a shallow n-well, in order to reduce blooming.

18. The imager array of claim 11, wherein the amplifier, reset and access circuitry for each pixel group is located within the dark pixel area.

19. The imager array of claim 11, wherein a passive pixel comprises a photocapacitor.

20. An imager array having a relatively high optical fill factor and low bus capacitance, the imager array comprising:
    a plurality of pixel groups, each pixel group comprising:
       a plurality of passive pixels located in close proximity to each other and connected to a common bus line, the common bus line being relatively short; and
       an amplifier connected to the common bus line, wherein the amplifier is located in close proximity to the plurality of passive pixels;
       wherein the average number of transistors per pixel in the array is less than two,
       wherein the plurality of passive pixels comprise four pixels, such that one pixel is a dark pixel used to subtract off an amplifier offset associated with the amplifier.

* * * * *